United States Patent
Miyazaki et al.

(10) Patent No.: US 6,275,399 B1
(45) Date of Patent: Aug. 14, 2001

(54) METHOD AND APPARATUS FOR DRIVING A SEMICONDUCTOR ELEMENT WITH VARIABLE RESISTANCE CIRCUITRY

(75) Inventors: Hideki Miyazaki, Hitachi; Katsunori Suzuki, Takahagi; Koji Tateno, Hitachi; Junichi Sakano, Hitachi; Masahiro Iwamura, Hitachi; Mutsuhiro Mori, Mito, all of (JP)

(73) Assignee: Hitachi, Ltd., Tokyo (JP)

( * ) Notice: Subject to any disclaimer, the term of this patent is extended or adjusted under 35 U.S.C. 154(b) by 0 days.

(21) Appl. No.: 09/654,892

(22) Filed: Sep. 5, 2000

(30) Foreign Application Priority Data

Jan. 31, 2000 (JP) .................................................. 12-027319

(51) Int. Cl.$^7$ .............................. H02M 7/68; H02M 7/44
(52) U.S. Cl. .............................................. 363/98; 363/132
(58) Field of Search ................................. 363/98, 56.02, 363/95, 132

(56) References Cited

U.S. PATENT DOCUMENTS

| | | | |
|---|---|---|---|
| 5,959,856 | * 9/1999 | Sturgeon | 363/98 |
| 5,959,857 | * 9/1999 | Nagahara | 363/132 |
| 6,040,989 | * 3/2000 | Thorn et al. | 363/41 |
| 6,069,809 | * 5/2000 | Inoshita | 363/98 |
| 6,166,935 | * 12/2000 | Tokashiki et al. | 363/98 |

FOREIGN PATENT DOCUMENTS 6291631   10/1994 (JP) ............................. H03K/17/687

* cited by examiner

Primary Examiner—Peter S. Wong
Assistant Examiner—Bao Q. Vu
(74) Attorney, Agent, or Firm—Antonelli, Terry, Stout & Kraus, LLP (57) ABSTRACT

In a driving apparatus of a power semiconductor element for conducting or interrupting a main current, first resistance variable for changing a first resistance according to a control voltage, and second resistance variable for changing a second resistance according to a voltage between a first and a second terminal are provided, and either one of a voltage of a control power supply or a voltage between the first and the second terminal is voltage-divided by the first resistance and the second resistance, and the divided voltage is applied to a control gate terminal at the time of conducting or interrupting the main current.

14 Claims, 8 Drawing Sheets

METHOD AND APPARATUS FOR DRIVING A SEMICONDUCTOR ELEMENT WITH VARIABLE RESISTANCE CIRCUITRY

BACKGROUND OF THE INVENTION

The present invention relates to a driving apparatus of a semiconductor element, and in particular, to a driving apparatus and its control method for suppressing an over-voltage generated at a transient time when a semiconductor element conducts or interrupts a current.

In electric power conversion systems such as electric automobiles or the like, using a battery as a power supply, an electric power conversion device such as an inverter is provided between a battery and a load (motor, etc.), and as a power semiconductor element used in the power conversion device, a power MOSFET is used when the voltage is low, and an IGBT is used when the voltage is high. The power MOSFET and the IGBT are both voltage drive type elements, and it is desirable to further reduce the on resistance from the need to achieve lower loss. In the voltage drive type power semiconductor element, its on resistance is determined by the sum of a resistance of a channel portion which is formed near the surface of the element and which limits a current according to a gate voltage, and a resistance of a semiconductor substrate portion which forms a depletion layer at an off time of the element. The resistance of the channel portion can be reduced by making the structure finer, but the resistance of the substrate portion is determined by the withstand voltage of the element, and it is impossible to reduce the resistance without reducing the voltage applied to the element at the off time. On the other hand, even if it is intended to reduce the voltage by reducing the voltage of the power supply, if the electric power supplied to the load is constant, the current flows through the element will increase conversely. In this case, since a large current is interrupted at a fast speed, it will result in an increase in the surge voltage (or, it is called as a spike voltage). Thus, it is considered to reduce the transient withstand voltage of the element by suppressing the surge voltage by countermeasures relying on circuits such as a snapper circuit, a gate driving circuit, etc.

As an example of a circuit technique for suppressing the surge voltage generated at the time when the element is turned on or turned off, a driving circuit is disclosed in JP-A-6-291631. This circuit detects a voltage between an input and an output terminal of a voltage drive type power semiconductor element, and the gate resistance is varied according to this detected value, thereby to make slow the speed at which the gate voltage of the element increases or decreases. The voltage drive type power semiconductor element has a saturation characteristic which limits a current conductable by the gate voltage, and when the increase or decrease in the gate voltage is suppressed, the switching speed of the current is also moderated. A parasitic capacitance is included between respective terminals, and in particular, the feedback capacitance between the input terminal and the gate terminal is limited at the transient time in its charging or discharging time due to the gate current. Accordingly, in the prior art technique mentioned above, this property is utilized, and a voltage change (dV/dt) at the time of switching is also moderated. In this manner, when a current change (di/dt), or the voltage change (dV/dt) is moderated, a surge voltage which is caused by the di/dt, and dV/dt is also reduced. In JP-A-6-291631, the gate voltage is detected together with a voltage between the input and output terminals, and a means for changing the gate resistance according to this detected result is also described. An article related to this prior art technique is described in Proceedings of National Conference of Institute of Electrical Engineers, Industrial Application Group, No. 88, "Study of Soft Switching Gate Driving circuit for driving IGBT", 1995. In the driving circuit described in this article, at the time of turn off, first, the voltage between the input and output terminals of the switching element is detected, and the gate resistance is changed from a small value to a large value. Subsequently, the gate voltage is detected, and the gate resistance is changed from a large value to a small value. It is reported that although the surge voltage at the time of switching was suppressed owing to this driving circuit, the overlapping period between a voltage and a current waveform becomes long at the on and off time, and as compared with the case where the prior art gate driving circuit is used, the switching loss is increased to a great extent.

In order to explain the problems in the prior art technique mentioned above, the turn off operation of the voltage drive type power semiconductor element is divided into four periods. Here, the object is an inductive load such as a motor.

(1) gate voltage discharge period: In this period, upon application of an off signal, a gate current flows through a resistance, and electric charge accumulated on the gate is discharged. The gate voltage is decreased with time in accordance with an exponential function having a time constant corresponding to the product of a gate capacitance and a resistance. During this period, a main current and a voltage between the input and output terminals are maintained at values at the on time.

(2) voltage rise period: In this period, the element enters into a saturation operation, and the feedback capacitance is charged by a gate current, and the voltage between the input and output terminals is increased depending on the degree of charging. Since the gate current is used to charge the feedback capacitance, the gate voltage is substantially at a constant value. Since the feedback capacitance has a voltage dependent property, and decreases according to the voltage between the input and output terminals, the voltage increase between the input and output terminals becomes fast from the halfway.

(3) current fall period: From the time point at which the voltage between the input and output terminals reaches the power supply voltage, the main current begins decreasing. A period from the start of decreasing of the main current until it becomes completely zero, is called as the current fall period. The gate voltage decreases again from the finish time point of the feedback capacitance charge period, and the main current decreases according to an instantaneous value of this gate voltage.

(4) off steady period: In this period, the gate voltage decreases to a threshold value or below, and the power semiconductor element is maintained at a state which interrupts the current.

In the case of the prior art technique mentioned above, the gate resistance value is made small during the gate voltage discharge period, and the gate resistance value is increased by detecting at the halfway of the voltage rise period that the voltage between the input and output terminals is increased. And during the voltage rise period and the current fall period, the gate resistance value is maintained at a large value. Then, the gate resistance is made to be a small value again by determining that the element has entered into the off steady state by detecting the gate voltage that this value reached the threshold value or lower.

In a general gate driving circuit, the gate resistance is small and at a constant value from the start of the gate voltage discharge period until the finish of the off steady period, and the voltage rise period and the current fall period are short at respectively several tens to several hundreds of nano seconds (ns). On the other hand, in the prior art technique mentioned above, when the gate resistance value changes from a small value to a large value during the voltage rise period, the voltage rise period and the current fall period are respectively extended to about one to several microseconds ($\mu$s). However, if a time delay is caused in the detection or operation, the operation to increase the gate resistance from the small value to the large value will not be performed in good time. In this case, since the current is interrupted in the state in which the gate resistance is small, the surge voltage is caused by a current change (di/dt). Thus, it is a first problem that there is a situation wherein the surge voltage cannot be suppressed.

A second problem is an increase in the delay time. Assuming that the frequency of a carrier wave of an inverter of the PWM (pulse width modulation) control type is several kHz, the non-lap time of upper and lower elements of the inverter has generally an upper limit of 5 $\mu$s (miroseconds), and as described above, the voltage rise time alone, it takes 3 to 5 us, and the PWM control becomes unsuitable.

The switching loss is increased due to the increase in the gate resistance value from the voltage rise period to the current fall period, however, it is a third problem to reduce the switching loss as far as possible while suppressing the surge voltage.

Furthermore, against the inductive load, a return diode is provided between the input and output terminals of the power semiconductor element, however, it was difficult to suppress the surge voltage at the time of reverse recovery of this diode.

SUMMARY OF THE INVENTION

A driving apparatus according to the present invention, is a driving apparatus of a power semiconductor element for conducting or interrupting a main current, comprising a power semiconductor element having a first and a second terminal for input and output of a main current, and having a control gate terminal; and driving circuit means for applying or removing a control voltage supplied from a control power supply to and from the control gate terminal responsive to an input signal; said driving apparatus further comprising: first resistance variable means including first resistance means for changing a resistance value according to the control voltage, and switching means for conducting or interrupting a current to and from the first resistance means according to the input signal; and second resistance variable means including second resistance means for limiting a conductable current according to a voltage between the first and second terminals, wherein one of the voltage of said control power supply and the voltage between the first and second terminals is voltage-divided by the first resistance means and the second resistance means, and the divided voltage is applied to the control gate terminal at the time of conducting or interrupting the main current.

Here, the first resistance variable means includes the first resistance means connected between the control gate terminal and the second terminal, switching means for conducting or interrupting a current to and from the first resistance means according to the input signal, first voltage detecting means for detecting a voltage between the control gate terminal and the second terminal, and first resistance control means for changing a resistance value of the first resistance means according to an output of the first voltage detecting means. Alternatively, the first resistance means includes a resistor connected between the control gate terminal and the second terminal, and capacitance means connected in parallel with the resistor.

The second resistance variable means includes second voltage detecting means for detecting a voltage between the first and the second terminal, amplifying means for comparing a difference between an output of the second voltage detecting means and a reference value set beforehand, and second resistance control means for changing a resistance value of the second resistance means. Also, another structure may be used in which a zener diode connected between the first and the second terminal is provided as the second resistance means, and a voltage between the first and the second terminal which is divided by the first resistance means and a voltage between the terminals of the zener diode is applied to the control gate terminal. Furthermore, limiting means for limiting the output of the amplifying means may be provided.

In a control method of the above-mentioned driving apparatus according to the present invention, by regulating at least one of a gain of the first resistance control means, or a reference value provided for the amplifying means, or a gain of the second resistance control means, it is possible to control the change with time of the control voltage to achieve a desired characteristic.

In another control method of the driving apparatus of a semiconductor element according to the present invention, it is a control method of a power semiconductor element which includes a control gate terminal, a first and a second terminal for input and output of a main current, and a diode provided between the first and the second terminal, for conducting or interrupting the main current by applying or removing a control voltage to and from the power semiconductor element, and in a process of removing the control voltage, a resistance provided between the control gate terminal and the second terminal is increased to a predetermined value, and a displacement current flowing into the control gate from the first terminal at the time of reverse recovery of the diode and a voltage drop caused by the resistance, are made to be an equivalent value to a gate threshold voltage of the power semiconductor element thereby to suppress a surge voltage at the time of reverse recovery of a return diode.

In a control method of a driving apparatus according to the present invention using a battery as a power supply, and a main current is supplied to a power semiconductor element from the battery through a condenser, assuming that a total value of parasitic inductance of wiring existing in a closed circuit including the condenser and the power semiconductor element is expressed by L, a static capacity of the condenser is expressed by C, an instantaneous value of the main current output by the power semiconductor element is expressed by I, an effective value of this current is expressed by Iav, an open circuit voltage of the battery is expressed by Vb, an internal resistance of the battery is expressed by Rb, and a reference value of the amplifying means or a voltage clamp value of the power semiconductor element determined by the zener diode is expressed by Vc, and a time tf in which the semiconductor element interrupts the current is determined to meet the following formula $$tf = L \times I/(Vc - Vb + Rb \times Iav)$$

and the reference value or the zener diode is set so that with respect to an instantaneous maximum value of the main current, the time tf is equal to 10% or lower of the time constant determined by Rb×C, thereby to obtain a good surge voltage suppressing effect.

Furthermore, in the case where an inverter portion is constituted including at least two power semiconductor elements connected in series, and where in order to PWM control the inverter portion, a control signal is supplied to the driving apparatus by a PWM signal generating portion, the current interruption time tf is calculated from the above-mentioned relationship $$tf-L \times I/(Vc-Vb+Rb \times Iav),$$

and at the same time, it is possible to obtain a required minimum delay time by providing a non-lap time longer than tf.

DESCRIPTION OF THE EMBODIMENTS

Figure 1:
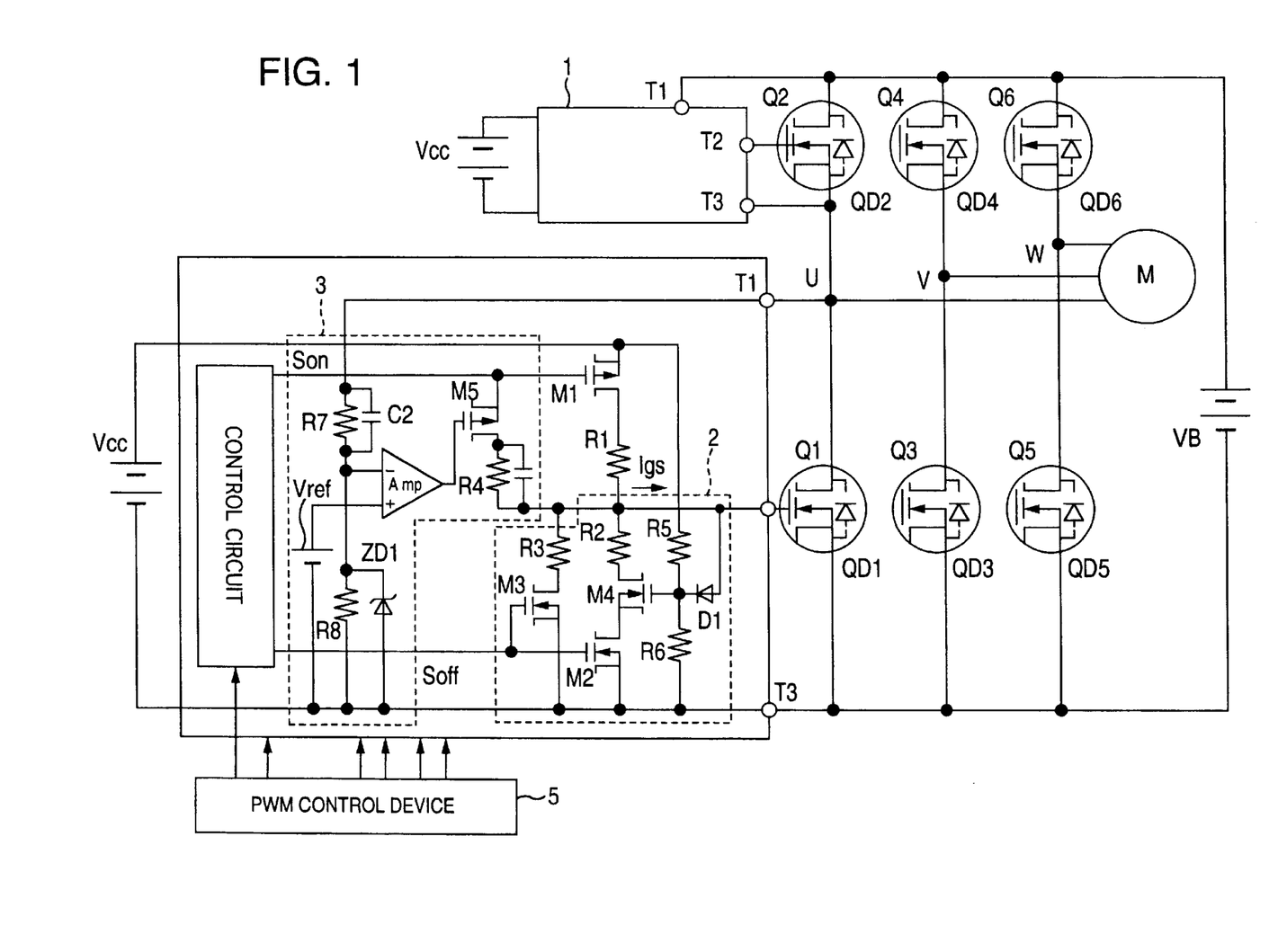
FIG. 1 is a circuit diagram of a driving apparatus showing a first embodiment of the invention.

Hereinafter, a first embodiment of the present invention will be described with reference to FIGS. 1 to 3. FIG. 1 shows a structure of an electric power conversion apparatus including power semiconductor elements and provided with a driving apparatus of the present invention. A main circuit includes six power semiconductor elements, each having a power MOSFET (e.g. Q1) and its built-in diode (e.g. QD1), connected between a positive pole and a negative pole of a power supply VB in 3-phase bridge connection so as to constitute a general 3-phase inverter. Output terminals of respective phases are represented by U, V, W, and connected to a motor M. Each of the power MOSFETs Q1 to Q6 has a driving apparatus 1. As an internal structure of the driving apparatus 1, gate charge means including a P-channel MOSFET M1 and a resistor R1 connected in series is connected between a positive pole of a control power supply Vcc and a gate terminal of Q1. A driving signal is sent from a PWM control device 5 to a control circuit 4 included in the driving apparatus 1, and the control circuit 4 produces an on signal Son and an off signal Soff to be supplied to Q1. When the on signal Son is applied to a gate terminal of M1, M1 is turned on, and a gate current is supplied to Q1 through R1, and an input capacitance Cgs between the gate and source terminals is charged. An area 2 enclosed by the chain line is first resistance variable means, and a first gate discharge circuit including series connected resistor R2, N-channel MOSFETs M4 and M2 is connected in parallel between the gate and source terminals of Q1, and furthermore, in parallel with this first gate discharge circuit, a second gate discharge circuit including series connected resistor R3 and N-channel MOSFET M3 is provided. Here, M2 and M3 have gate terminals connected in common, and when the off signal Soff is applied to the gate terminals from the control circuit 4, they enter into an on state. Also, within the first resistance variable means 2, resistors R5 and R6 are connected in series between the positive pole and negative pole of the control power supply Vcc, and a diode D1 is connected between the positive pole and negative pole of the control power supply Vcc so that the cathode is connected to a junction point of the resistors R5 and R6, and the anode is connected to the gate terminal of Q1. The resistors R5 and R6 and the diode D1 form a bias circuit of N-channel MOSFET M4. This bias circuit compares a voltage obtained by dividing Vcc by R5 and R6 (defined as V1) with the gate to source voltage Vgs of Q1, and applies a larger voltage to the gate of M4. When the signal Soff is applied to M2 and M3, these elements are turned on, however, just after the application of Soff, since the gate to source voltage Vgs of Q1 is larger than the divided voltage V1, and thus this value is applied to the gate of M4. When a voltage equal to Vgs is supplied, an on resistance of M4 becomes a small value. Assuming that a combined resistance of the above-mentioned first gate discharge circuit (R2, M4, M2) is RT1, and that a combined resistance of the second gate discharge circuit (R3, M3) is RT2, under the condition that the gate voltage of M4 is approximately close to a rated value of Vgs, it is selected so that RT1 becomes smaller than RT2. At this time, it is desirable that the ratio of RT1/RT2 is equal to one tenth or lower (1/10).

Next, an area 3 enclosed by the short dashed line is second resistance variable means, and within this area, there are provided with a gate charge circuit including a P-channel MOSFET M5 and a resistor R4 connected in series between the positive pole of Vcc and the gate terminal of Q1, and a capacitor C1 is connected in parallel with the resistor R4. Also, voltage dividing means formed by resistors R7 and R8 is connected between the drain terminal and the source terminal of Q1, and a voltage divided value (V2) of the drain to source voltage Vds of Q1 is obtained. Here, a zener diode ZD1 is connected in parallel with R8, and an upper limit value of V2 is limited to a breakdown voltage of ZD1. Also, a capacitor C2 is connected in parallel with R7, and with respect to a transient change of Vds, a voltage dividing value is determined by an impedance of C2 and R8, and thereafter when Vds is settled to a steady value, it is designed so that the voltage divided value V2 is determined by R7 and R8. Such an operation of the capacitor C2 is called as a speed-up condenser. The above-mentioned capacitor C1 which is in parallel with R4 also operates as the speed-up condenser. In other words, at the instant of turn-on of M5, the resister R4 is bypassed by the impedance of C1. The voltage divided value V2 and the reference value Vrf are respectively applied to a (−) input terminal and a (+) input terminal of the amplifier 6. In the amplifier 6, when the voltage divided value V2 increases exceeding the reference value Vrf, the potential of the output falls, and as a result, the P-channel MOSFET M5 is turned on.

Figure 3:
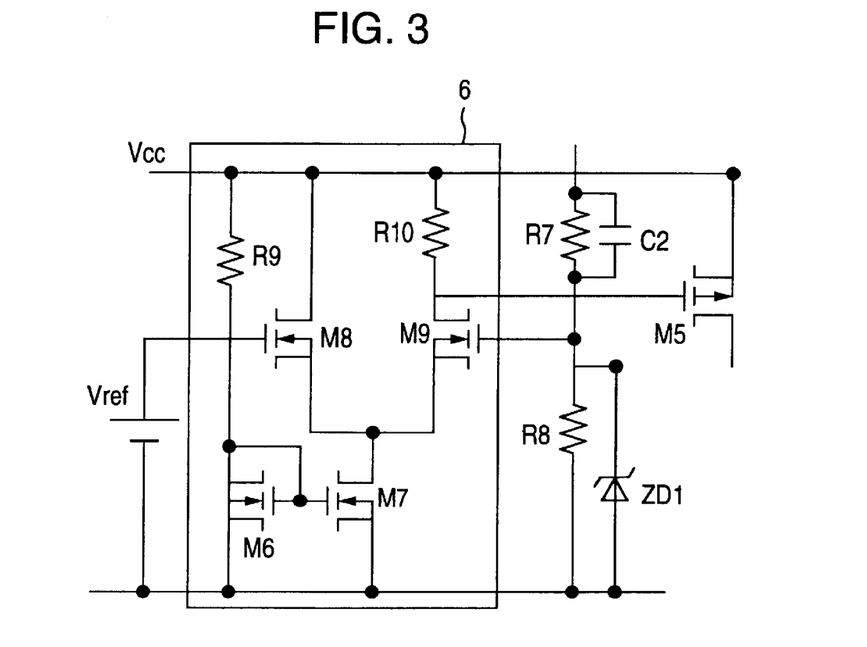
FIG. 3 is a circuit diagram of an amplifier with its gain normalized.

A detailed structure of the amplifier 6 is shown in FIG. 3. It is basically a differential amplifier, and a current mirror circuit formed by a resistor R9 and N-channel MOSFETs M6 and M7 constitutes a constant current source, and a total value of currents of N-channel MOSFETs M8 and M9 which constitute a differential portion is equal to the constant current. In a general differential amplifier, the drain terminal of M8 and the drain terminal of M9 are connected to a current mirror type load, and it is designed to enable a high gain of the amplifier. On the other hand, in the structure of FIG. 3, there is no load resistance on the drain side of M8, and a resistor R10 is connected only to the drain side of M9. The constant current mentioned above is divided into two by an on resistance of M8 (depends on reference value Vref) and a combined resistance of an on resistance of M9 (depends on V2) added with R10, and thus, the gain is small and has the characteristic in which the gate voltage of M5 increases lineally according to a difference voltage between the voltage divided value V2 and the reference value Vref. In the embodiment of FIG. 1, as described later, the control voltage Vcc is voltage divided by the first resistance variable means and the second resistance variable means so as to apply the divided voltage to the gate terminal of Q1, and the surge voltage at the time of switching is suppressed by suppressing a change with time in gate voltage Vgs of Q1. In this case, when the gain (the rate of change of resistance with respect to the detected value of Vgs or Vds) of the first resistance variable means or the second resistance variable means is too high, the voltages Vds and Vgs of Q1 become oscillatable. Thus, it is desirable that these gains are properly small, and FIG. 3 is one example thereof.

Next, the surge voltage suppressing effects by the embodiments of FIGS. 1 and 3 will be explained by using an operation waveform of FIG. 2.

Figure 2:
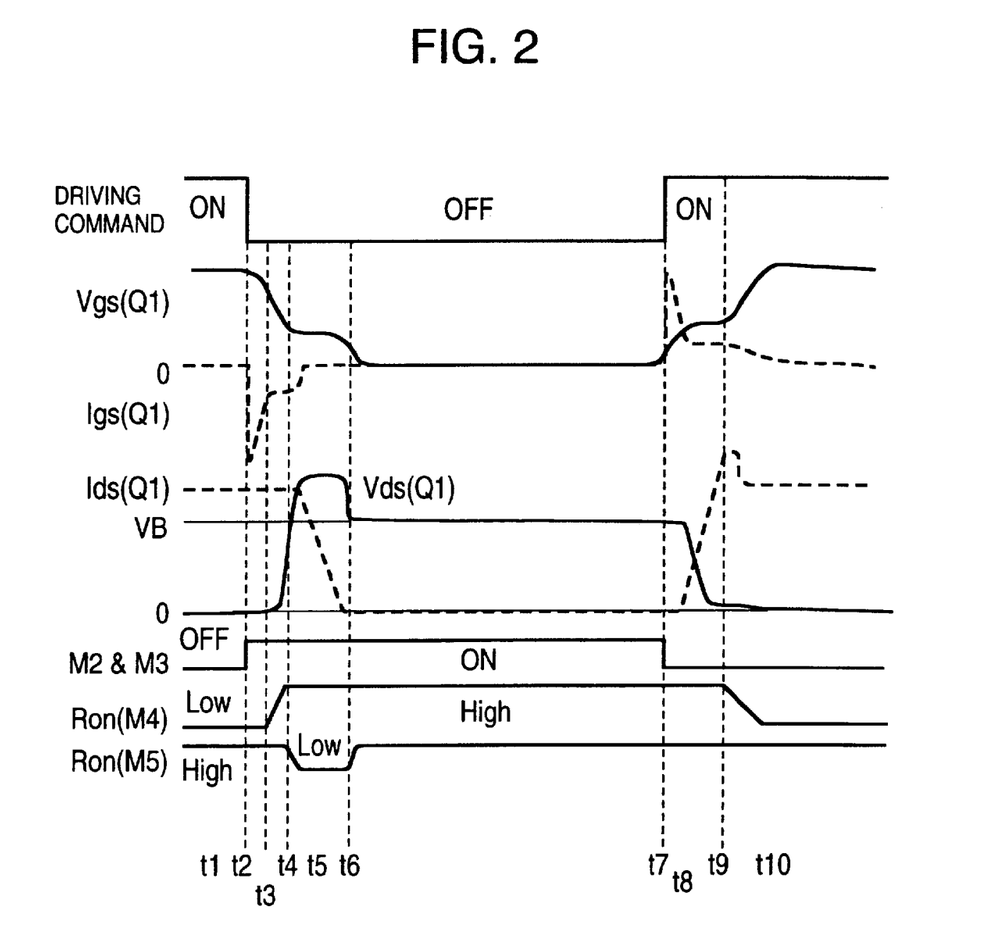
FIG. 2 is an operation waveform diagram.

FIG. 2 shows with respect to a driving command to Q1, each waveform of the gate to source voltage Vgs (Q1) of Q1, gate current Igs (Q1), and drain to source voltage Vds (Q1), and on and off operation of M2 and M3, and a change with time of on resistance Ron of M4 (M4) and on resistance Ron of M5 (M5). From time t1 to t2, Q1 is in an on state, and after t2 to t7, in an off operation. At time t2, although not shown, M1 is turned off, and as shown in FIG. 2, M2 and M3 are turned on. Here, in the on state before t2, Vgs (Q1) has been charged to a voltage value nearly equal to the control voltage Vcc, and when M2 is turned on, a gate voltage nearly equal to Vgs (Q1) is applied between the gate and source of M4. As a result, the on resistance Ron (M4) of M4 decreases to a very small value. Assuming that the sum of resistance of R2 and Ron (M4) and on resistance of M2 is equal to 1/10 or lower of the sum of the resistance of R3 and on resistance of M3, as mentioned in the foregoing, the sum of resistance of R2 and Ron (M4) and on resistance of M2 serves as a discharge resistance of the gate voltage, and the electric charge accumulated between gate and source of Q1 is rapidly discharged. This occurs in a period from t2 to t3, and this corresponds to the above-mentioned gate voltage discharge period. At this time, the gate current Igs (Q1) of Q1 assumes a maximum current value during turn off operation of the gate current Igs (Q1) of Q1.

Next, after t3, as a result of the decrease of the gate voltage Vgs (Q1) of Q1, the gate voltage of M4 is also decreased, and its on resistance Ron (M4) becomes high depending on the decrease of Vgs (Q1). Although not shown in FIG. 2, this is because of the decrease of the voltage V1 shown in FIG. 1. Also, due to the increase of Ron (M4), Igs (Q1) becomes low. This state continues to a period from t3 to t4, and in the half-way, a feedback capacitance is charged by Igs (Q1), and the drain to source voltage Vds (Q1) is increased. This corresponds to the voltage rise period. The current characteristic of M4 is selected such that when Vgs (Q1) becomes smaller than a certain voltage (for example, less than or equal to ½ to ⅓ of the control voltage Vcc), the increase of Ron (M4) becomes significant, and the sum of resistance of R2 and Ron (M4) and on resistance of M2 increases to not less than 10 times as large as the sum of the resistance of R3 and on resistance of M3. As a result, from the half-way of the period of t3, the gate to source resistance of Q1 becomes nearly equal to the sum of the resistance of R3 and on resistance of M3, and moreover, since the on resistance of M3 is selected to be sufficiently smaller compared to the resistance value of R3, it is only necessary to consider the resistance of R3 alone as the gate to source resistance of Q1. In this respect, the change with time (dV/dt) of the drain to source voltage Vds (Q1) becomes small as the Ron (M4) increases.

At the half-way of the voltage rise period, when the voltage divided value V2 of the Vds (Q1) divided by R7 and R8 becomes greater than or equal to the reference value Vref, by the amplifier 6, the output voltage corresponding to the difference voltage of (V2−Vref) is applied as the gate voltage of M5, and M5 is turned on. The time at which M5 Is turned on is assumed to be t4. In FIG. 2, the value of Vref is selected so that Vds (Q1), at the time when the voltage divided value V2 and the reference value Vref become nearly equal to each other, becomes nearly equal to the voltage VB of the main power supply. Here in this embodiment, during the period from t3 to t4, first, the on resistance Ron (M4) of M4 increases according to the gate voltage Vgs (Q1) of Q1, and as a result, the gate discharge resistance value of Q1 is increased, the charging current of the feedback capacitance of Q1 is decreased, and the charging of the feedback capacitance becomes slow. This means that the voltage rise of the drain to source voltage also becomes slow, and this prevents as in the prior art example, that the voltage rise is too fast and the detection of Vds (Q1) is delayed. Furthermore, the increase of the voltage divided voltage V2 becomes fast due to the effect of the speed-up condenser C2, and this contributes also to shorten the detection delay. Furthermore, just after the turn on of M5, the series impedance of M5 becomes small at one moment due to the speed-up condenser C1, however, this also has an effect of shortening the operation delay of the resistance variable means.

In the period from t4 to t6, both of the first resistance variable means 2 and the second resistance variable means 3 are operating. The first resistance variable means 2 has between the gate and the source of Q1, a combined resistance value RT1 formed by combining the sum of the resistance of R2 and Ron (M4) and on resistance of M2, and the sum of the resistance of R3 and on resistance of M3 in parallel with each other, and on the other hand, the second resistance variable means 3 has a combined resistance value RT2 determined by the sum of the resistance of R4 and Ron (M5), and thus. the gate voltage of Q1 is a value obtained by voltage dividing the control voltage Vcc by RT1 and RT2. Assuming this value is Vo, in the current fall period of t5 to t6, even when the current change (di/dt) intends to generate a surge voltage, due to the operation of the amplifier against the increase of Vds (Q1), the Ron (M5) is further decreased, and the operation to increase Vo is effective. When Vo increases, the transient impedance of Q1 becomes low, and the trend to suppress the interruption of current is effective. In this manner, the voltage division of the first resistance variable means and the second resistance variable means has the effect in that they detect the gate voltage Vgs (Q1) and the drain voltage Vds (Q1) respectively, and perform feedback control so that Vgs (Q1) becomes a stable value Vo. By virtue of this effect, the current change (di/dt) is suppressed, and the surge voltage is limited to a minimum. Although it is not shown in FIG. 1, assuming that the parasitic inductance of the wiring for supplying the current to Q1 from the main power supply VS is expressed by Ls, the instantaneous value of the main current interrupted by Q1 is expressed by I, and the maximum value of Vgs (Q1) including the surge voltage is expressed by Vc, the time tf required for Q1 to interrupt the current I has the following relationship $$Ls \times di/dt - Vc - VB \quad (1)$$

Furthermore, when di/dt is linearly approximated, it can be expressed by $$tf - Ls \times I/(Vc - VB) \quad (2)$$

This rf is equal to a time from t5 to t6, and in this time, the overlapping between the drain voltage Vds (Q1) and the drain current Ids (Q1) is caused and results in the turn off loss, and its value is equal to electromagnetic energy stored in the parasitic inductance Ls of the wiring. Since this electromagnetic energy is generated at the time of turn off without fail, it can be said that the turn off loss is also suppressed to a required minimum.

In FIG. 2, after the time t7, the turn on even if the control voltage is applied to the gate of Q2, because the current direction is reverse to the MOSFET Q2. The reverse recovery of QD2 occurs when Q1 is changed from off-state to on-state by the control signal and control voltage of Q2 is removed just before the occurrence of the recovery of QD2. This operation is well known for the conventional inverters.

Figure 4:
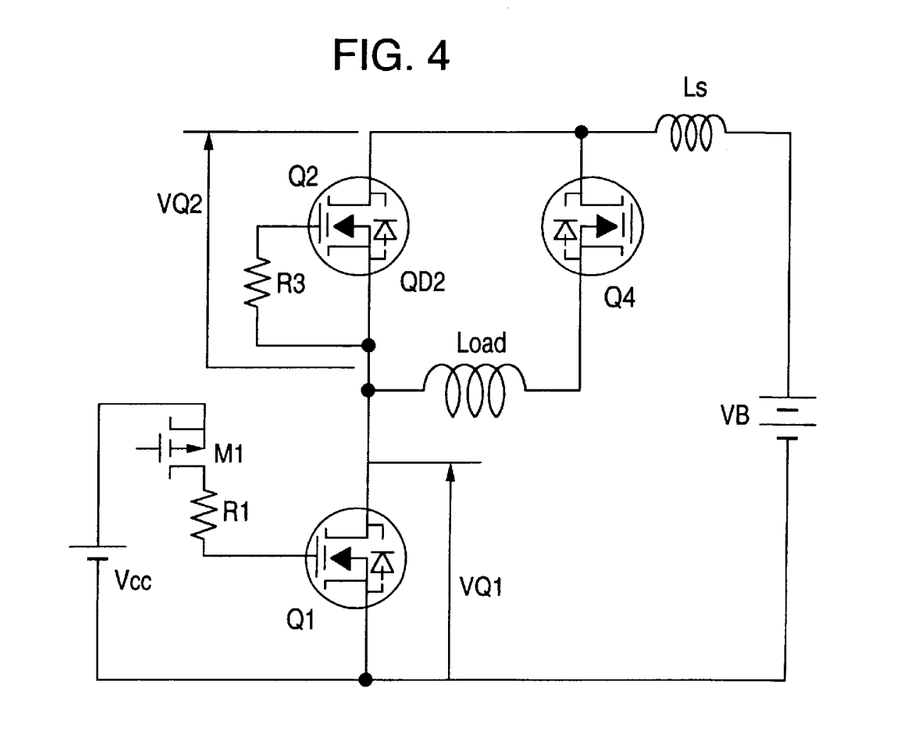
FIG. 4 is a circuit diagram for explaining the reverse recovery of a diode.

In FIG. 4, Ls is shown as a new part, and Ls represents a parasitic inductance of the wiring connecting the positive pole of the gate main power supply VB of Q2 and the drain terminals of Q2 and Q4. Also, the load in FIG. 1 was the motor M, but in FIG. 4, it is shown as an inductive load.

FIG. 5 presents an operation explanation at the time of reverse recovery of diode QD2, and operation waveforms respectively. First, FIG. 5A is the case where the prior art driving device is used. The resistor R3 in FIG. 5A has a resistance value less than or equal to 1/10 as compared with R3 in the present invention. In the prior art driving device, the gate resistance is not changed from the start of turn off of the t2 period shown in FIG. 2 to the finish of the off state of t7 period, this is because that generally the off gate resistance is selected for the purpose of allowing a large gate current to flow in the period of t2 to t3. The small resistance of R3 makes discharge the gate voltage of Q2 quickly and the gate and source of Q2 is nearly zero before the occurrence of the recovery of QD2. FIG. 5B shows an operation is performed, however, in the embodiment of FIG. 1, at the time of turn on of Q1, no particular operation is performed, and similar to the prior art driving apparatus, a current is supplied between the gate and source of Q1 through the resistance of R1, to increase the gate voltage. At this time, although a return diode QD2 provided in parallel with Q2 performs reverse recovery, also the surge voltage generated at the time of reverse recovery of this diode can be suppressed by the driving apparatus 1 of the present invention provided for Q2. This will be explained in detail with reference to FIGS. 4 and 5.

FIG. 4 is a diagram for explaining the state at the time of reverse recovery of the diode QD2. The circuit components shown in FIG. 4 and identical to those in FIG. 1 are attached with the same reference numerals, and explanation thereof is omitted. As the point different from FIG. 1, for the 3-phase inverter, only three power semiconductor elements Q1, Q2, and Q4 are shown. This is because that only those elements necessary to explain the operation of QD2 are shown and the others are omitted, and the accurate structure is the same as FIG. 1.

Figure 5A:
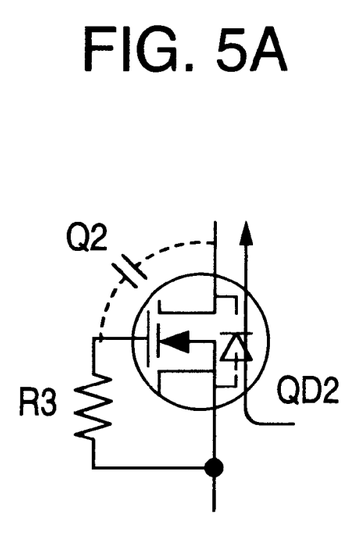
FIGS. 5A to 5D are diagrams for explaining an operation of the diode at the time of reverse recovery.
Figure 5B:
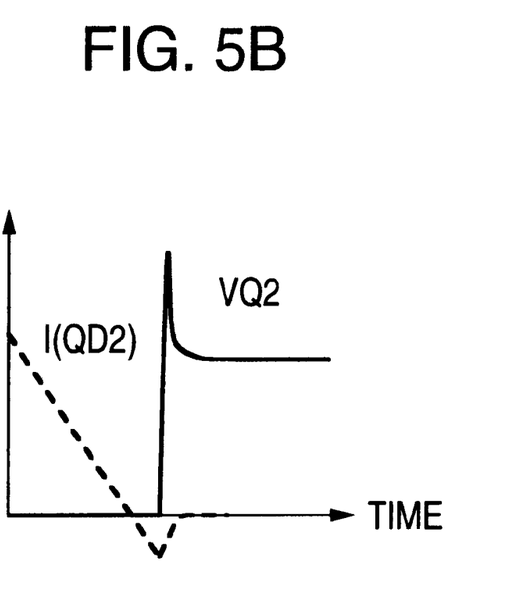

In Fig.4, the inverter apparatus supplies on-state signal to the gate circuits provided for Q1 and Q2 alternatively. Assuming the direction of the load current as flowing through QD2 or Q1, and Q4, a free-wheeling current flows through QD2 when Q1 is turned off, operation waveform in the prior art driving device, and the return current I (QD2) is shown as having a positive polarity when it flows from the anode to cathode of QD2. In FIG. 5B, I (QD2) decreases and it will soon reach less than or equal to zero, however, a current of opposite polarity flows until all the electrons and holes accumulated in QD2 are discharged. This is the phenomenon called as reverse recovery. The reverse recovery current begins decreasing after the time point at which it reached the peak, and a reverse voltage (VQ2 in the diagram) having a positive polarity at the cathode is applied to QD2. This reverse voltage, as shown in FIG. 5B, has a large voltage change (dV/dt), and also a spike voltage is superimposed. This spike voltage is generated by the parasitic inductance Ls and by the current change (dI/dt) at the time of decreasing the reverse recovery current. Due to the voltage VQ2 having a large (dV/dt), and also superimposed with a spike voltage, a current flows which charges the feedback capacitance between the drain and gate of Q2, and this charging current flows towards the source of Q2 through R3. In the prior art driving device, since the resistance of R3 is small, a voltage drop caused in R3 by the charging current of the feedback capacitance is small, and generally, the value of R3 has been selected so that this voltage drop is less than or equal to the threshold voltage of Q2.

Figure 5C:
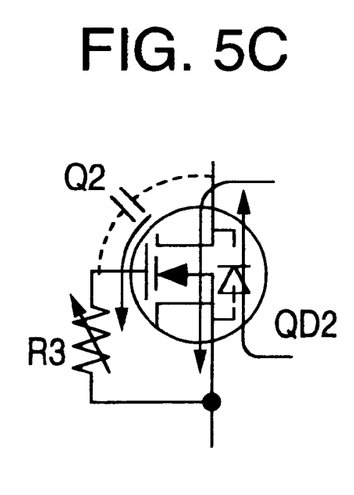
Figure 5D:
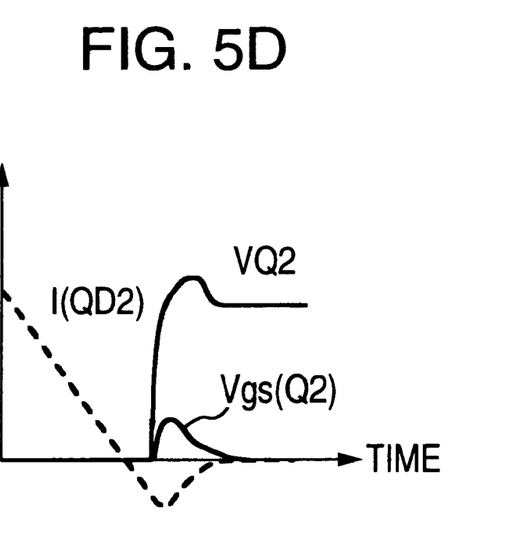

FIG. 5C shows an operation using a driving apparatus of the present invention. The phenomenon until QD2 performs the reverse recovery and the voltage VQ2 having a large voltage change (dV/dt) is generated is the same as the prior art case. Also, the operation that the resistance of R3 makes discharge the gate voltage of Q2 is same as the prior art case, however, the gate voltage of Q2 is greater than zero, before the occurrence of the recovery of QD2., because discharge time of the gate voltage is not enough due to large resistance of R3. Here, in the case where a current which charges the feedback capacitance of Q2 flows by the voltage VQ2, and this charging current generates a voltage drop in R3 and this voltage drop is add to the remained gate voltage of Q2, in the present invention, since the resistance of R3 is 10 times or more larger as compared with the prior art, a voltage Vgs (Q2) as shown in FIG. 5D is generated between the gate and source of Q2. The value of R3 is determined so that a peak value of this voltage is slightly larger than the gate threshold voltage of Q2. As a result, the MOSFET Q2 is turned on in a moment, and a current as shown in FIG. 5C flows from the drain to source. Since the gate voltage of the turned on MOSFET Q2 is not sufficiently large, although its resistance is larger as compared with the period from t1 to t2 in FIG. 2, it presents a far more small value as compared with the off state in the prior art case of FIG. 5A. Furthermore, since the current of Q2 flows in addition to the reverse recovery current of QD2, the current I (QD2) of FIG. 5D has a long conduction period as compared with FIG. 5B, and also the current change (dI/dt) is small. In this manner, when (dI/dt) becomes small, the spike voltage as shown in FIG. 5B is not generated, and the electromagnetic energy accumulated in the parasitic inductance Ls is consumed by the loss determined by the product of the voltage VQ2 and the current I (QD2). In the present invention, the dV/dt break-through of MOSFET Q2 which has been avoided in the prior art driving device is made to occur, and the spike voltage is suppressed by utilizing this break-through. The current of MOSFET Q2 which flows due to the voltage change (dV/dt) at the time of reverse recovery presents a drawback of increasing the switching loss as compared with the prior art driving device, however, if the resistance value of R3 is selected to be optimum, it is possible to suppress the increase of loss due to the conduction of Q2 to a minimum. Furthermore, as in the present invention, if the spike voltage is suppressed, since the withstand voltage of the element Q2 can be made smaller than prior art, it is possible to reduce the on resistance of Q2. According to the present invention, although the switching loss is increased, it is possible to reduce the on-resistance and to reduce the steady loss by decreasing the withstand voltage of the element. If the reduction of the steady loss is larger as compared with the increase of the switching loss, the effect of lower loss will be achieved as a whole.

Figure 6:
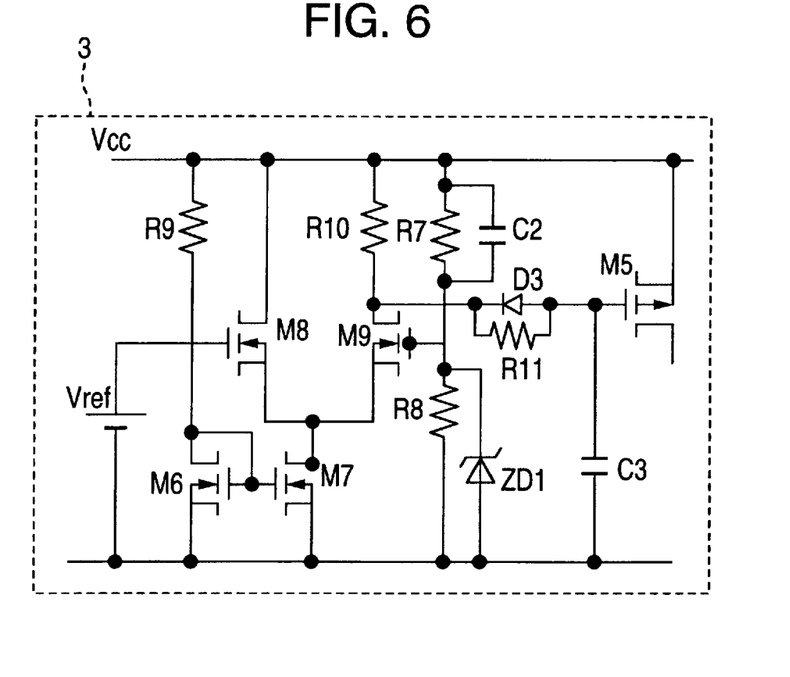
FIG. 6 is a circuit diagram an amplifier provided with delay means.

FIG. 6 shows a second embodiment relating to the second resistance variable means 3 shown in FIG. 1. The different point from the structure of FIG. 1 is that in FIG. 1, the output of the amplifier is directly applied to the gate of M5, whereas in FIG. 6, the output is applied to the gate of M5 through delay means formed by a diode D3 and its parallel resistor R11, and a capacitor C3 connected between the anode terminal of D3 and a negative pole of Vcc. By virtue of the effect of this delay means, when the gate potential of M5 is lowered, the voltage of C3 is discharged through D3 having a small resistance, and thus, its delay time is slight. On the other hand, when the gate potential of M5 rises, the voltage of C3 is charged through R11 having a large resistance, and time delay occurs according to the time constant of R11 and C3. According to this delay means, even when Vds (Q1) is reduced at the time t6 in FIG. 2, M5 does not interrupt the heretofore conducting current rapidly but interrupts slowly. This offers the effect of slowly reducing the gate voltage Vgs (Q1) just after the time t6, and it is possible to suppress the oscillation of waveform of Vds (Q1). If the time constant determined by resistor R11 and capacitor C3 included in the delay means is selected so that it is about 5 to 10 times longer with respect to a resonance period determined by the parasitic capacitance (Coss) between the drain and source of Q1 and the parasitic inductance Ls of the wiring as shown in FIG. 4, it is possible to prevent the Vds (Q1) from oscillation after the time t6.

Figure 7:
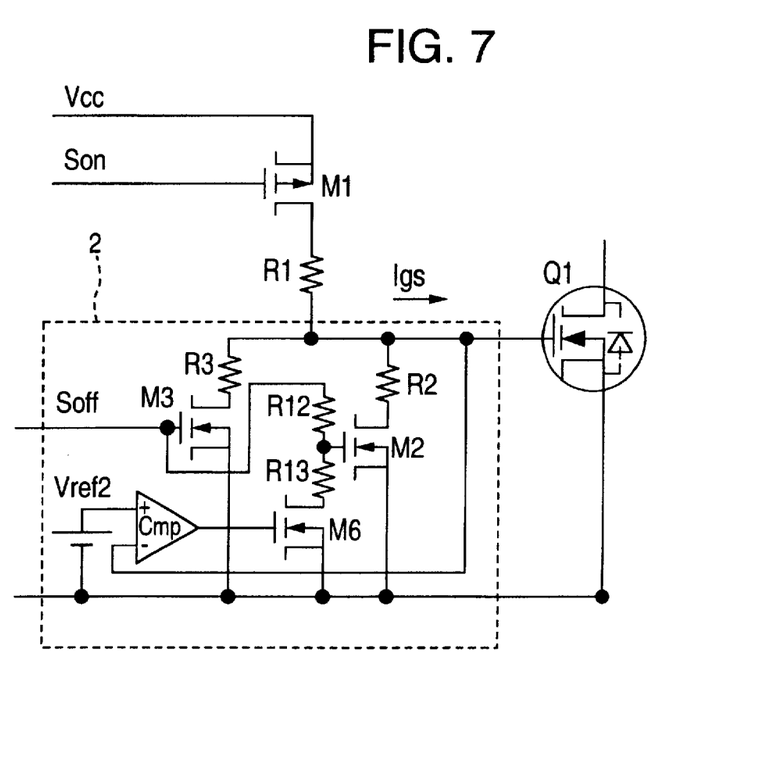
FIG. 7 is a diagram showing a second embodiment relating to a first resistance variable means.

FIG. 7 shows a second embodiment relating to the first resistance variable means 2 shown in FIG. 1. The different point in FIG. 7 from FIG. 1 is that, first, the resistor R2 and the n-channel MOSFET M2 are connected in parallel between the gate and source of Q1, and the control signal Soff is supplied to a series connection of resistor R12, resistor R13, and MOSFET M6. The gate signal is supplied from the junction point between R12 and R13 to M2. A comparator 7 compares the voltage between the gate and source Vgs (Q1) of Q1 with a reference voltage Vref2, and a signal is output from the comparator 7 so that M6 is off when the gate voltage Vgs (Q1) is higher than the reference voltage Vref2, and M6 is on when the gate voltage Vgs (Q1) becomes low. In other words, since M6 is off when Vgs (Q1) is higher than Vref2, the voltage of the control signal Soff is applied to M2 as it is through the resistor R12. In this case, the resistors R2 and R3 become parallel, however, similar to FIG. 1, R2 is selected to be less than or equal to 1/10 as compared with R3, so that a combined resistance is nearly equal to R2 alone. The gate voltage of the gate voltage Vgs (Q1) of Q1 is rapidly discharged by this combined resistance.

When Vgs (Q1) becomes lower than Vref2, since M6 is being turned on, the voltage obtained by voltage dividing the control signal Soff by R12 and R13 is applied as the gate voltage of M2. When the gate voltage is reduced lower than the voltage divided voltage by R12 and R13, the on resistance of M2 becomes high. If the current characteristic of M2 is selected so that the on resistance of M2 is increased, and its value becomes far higher as compared with R13, the combined resistance connected between the gate and source of Q1 becomes a value nearly equal to R3. As a result, the gate voltage Vgs (Q1) of Q1 is slowly discharged, and the operation becomes similar to that described in FIGS. 1 and 2. When comparing FIG. 1 with FIG. 7, in the case of FIG. 1, since M2 and M4 conduct a large gate current at the initial stage of turn off, MOSFETs having a large current rating is necessary. In FIG. 7, M2 also requires a MOSFET having large rating, however, since M6 limits the current by R12 and R13, M6 may have a small current rating as compared with M2. If it is possible to lower the current rating of MOSFETs which are to be used, it leads to a lower cost, and in particular, the lower cost is effective when the driving apparatus is to be formed by an integrated circuit.

Figure 8:
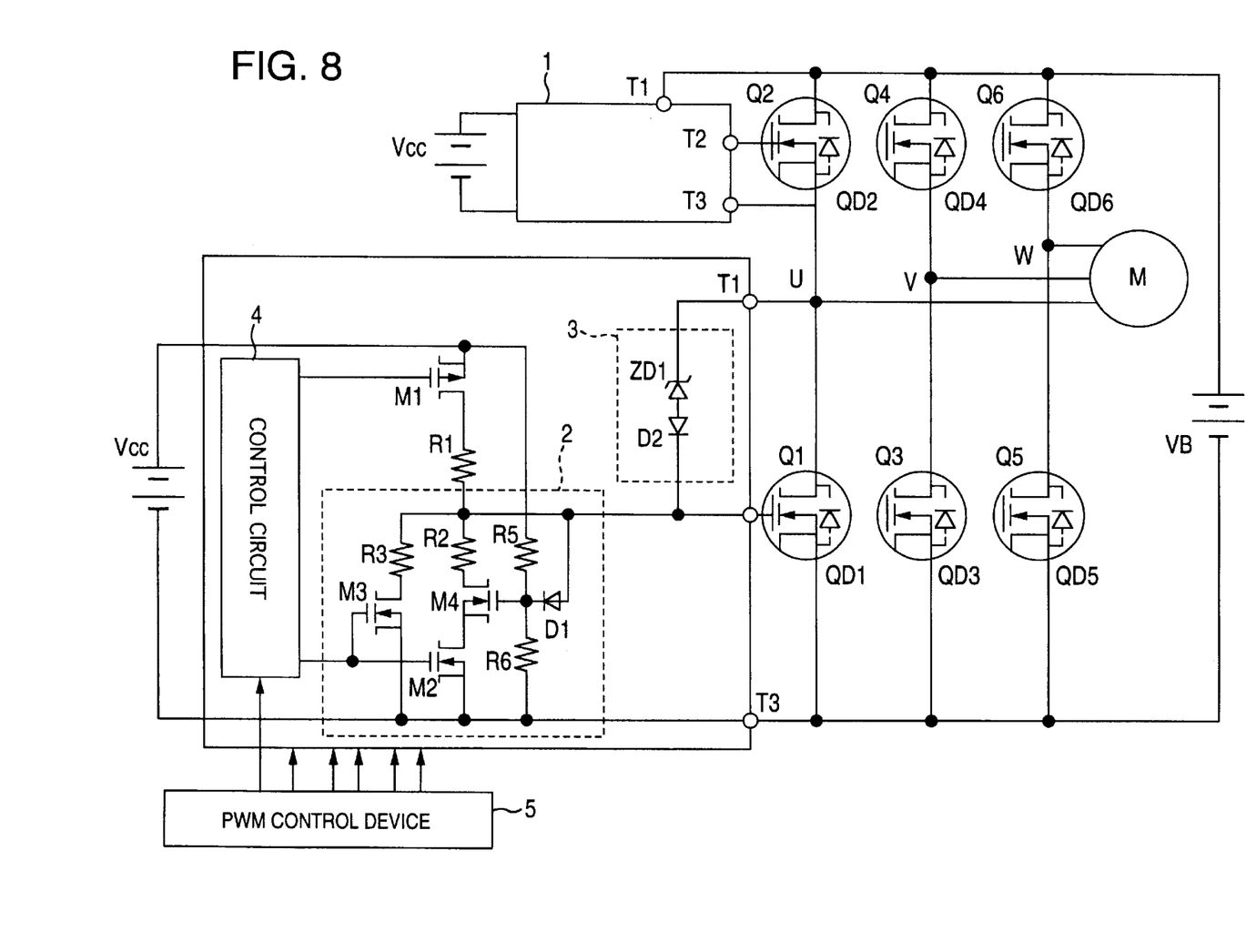
FIG. 8 is a circuit diagram of a driving apparatus showing a second embodiment of the present invention.

FIG. 8 shows a second embodiment relating to the driving apparatus of the present invention. In this respect, an electric power conversion apparatus of the inverter type shown in FIG. 8 is similar to that in FIG. 1, and only the second resistance variable means 3 enclosed by dashed line of the driving apparatus 1 is different. The second resistance variable means 3 in FIG. 8, when using the power MOSFET of Q1 as an example, includes a series connection consisting of a zener diode ZD2 and a diode D2 between the drain terminal and the gate terminal. In the present invention, it is the characteristic feature in that the voltage Vds (Q1) between the drain and source of Q1 is voltage divided by the above-mentioned series connection consisting of ZD2 and D2 and the first resistance variable means 2, and this voltage divided voltage is applied as the gate voltage of Q1. Examples have been known heretofore in which for the purpose of protecting over-voltage of the power semiconductor element, similar to FIG. 8, a zener diode is provided between the drain terminal and gate terminal, however, when this method is used for the purpose of suppressing the surge voltage generated at the time of switching, since the zener diode is broken down each time the switching is performed and current flows, the loss of the zener diode is the problem. In the present invention, by using both the zener diode and the resistance variable means at the same time, it is aimed to suppress the surge voltage and also to reduce the loss of the zener diode.

In this respect, it is desirable in view of the reduction of the loss and delay time to select the property of the breakdown voltage of the zener diode to be equal to that of the voltage VS of the main power supply.

Figure 9:
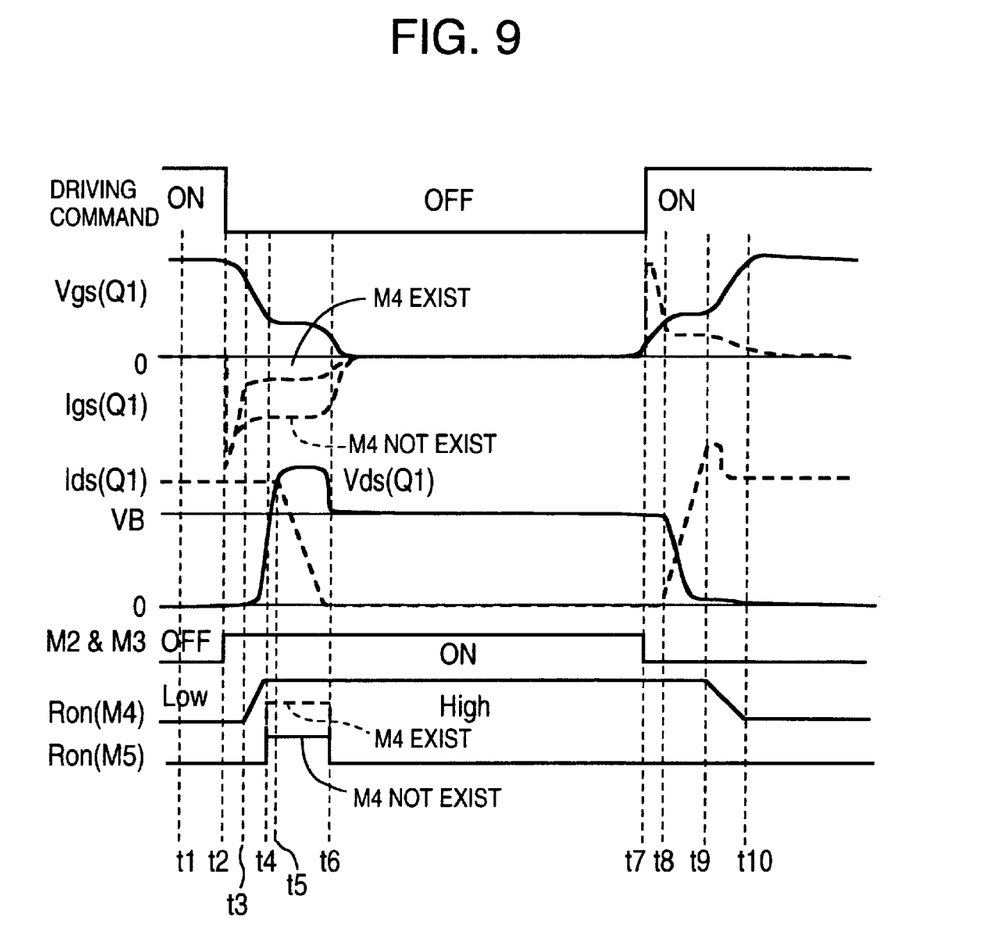
FIG. 9 is a diagram for explaining an operation of the driving apparatus of FIG. 8.

FIG. 9 shows operation waveforms in the case where the driving apparatus of FIG. 8 is used, and the operation until the time t4 is similar to FIG. 2. At the time t4, when the voltage Vds (Q1) between the drain and source of Q1 exceeds the breakdown voltage of the zener diode ZD2, a current flows through ZD2, and this current flows through a first gate discharge resistance including R2, M4, and M2, and a second gate discharge resistance including R3 and M3. Here let us suppose such a case in which the first gate discharge resistance does not include M4, and only M2 which is turned on responsive to the control signal and R2 are included. Although the second gate discharge resistance is provided, since the value of R2 is less than or equal to 1/10 as compared with R3, the combined gate discharge resistance is nearly equal to R2, and has a small value. This exhibits the same characteristic as the example in the prior art in which a zener diode is provided for over-voltage protection. Specifically, in this situation, the small resistance of R2 is acting to reduce the voltage Vgs (Q1) between the gate and source of Q1, and the gate current flowing R2 is large. When ZD2 breaks down, the current of ZD2 flows in R2, and this current increases to a value nearly equal to the gate current which flows through R2. At this time, the current allowed by R2 to pass through is a value obtained by dividing the voltage Vgs (Q1) between the gate and source of Q1 by R2. When the current of ZD2 increases to the current value allowable by R2 to pass through, the gate voltage Vgs (Q1) does not decrease more than that, and the current is interrupted slowly. Also, since the current change (dI/dt) becomes small, the surge voltage can be suppressed. In FIG. 9, the current fall period from t5 to t6 corresponds to this, and it can be said that the voltage obtained by voltage-dividing the voltage Vds (Q1) between the drain and source of Q1 by ZD2 and R2 is applied as the voltage Vgs (Q1) between the gate and source of Q1. On the other hand, the current allowable by R2 to pass through becomes larger as the value of R2 is smaller, and the loss is caused in the zener diode determined by the product of this current and the breakdown voltage.

Next, in the case of the driving apparatus according to the present invention, as shown in FIG. 2, until the time t3, the on resistance of M4 is small, however, thereafter, the on resistance of M4 is increased depending on the decrease of the gate voltage Vgs (Q1) of Q1, and at the time t4, the combined value of the gate discharge resistance has become a large resistance of R3 which is larger than or equal to 10 times as compared with R2. As a result, the current which flows at the time of breakdown of ZD2 decreases to a great extent as compared with the case where M4 is lacking. Accordingly, it is possible to achieve the suppression of the surge voltage of Q1, and at the same time, the reduction of the loss of the zener diode remarkably.

Figure 10:
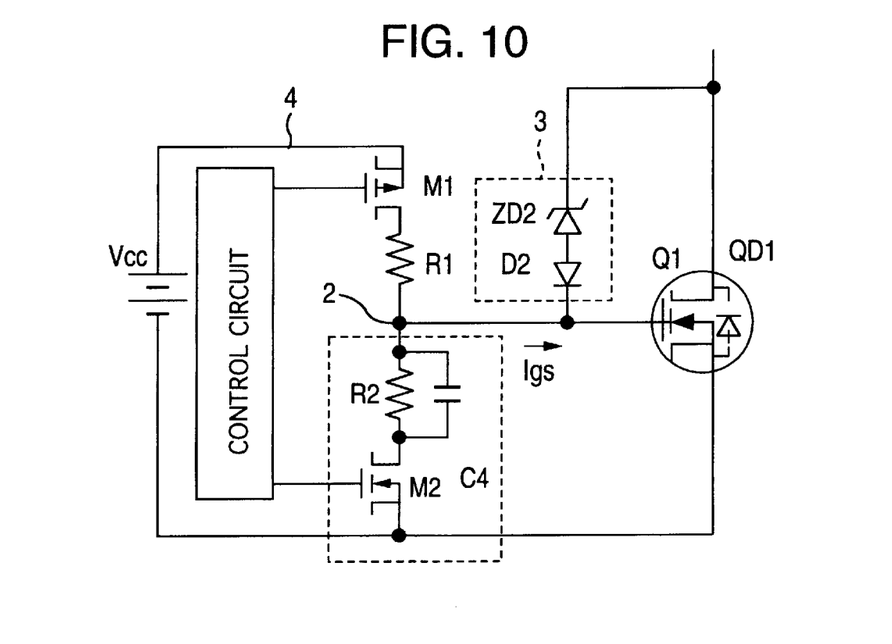
FIG. 10 is a diagram showing a third embodiment relating to the first resistance variable means.

FIG. 10 shows an embodiment to achieve the first resistance variable means by using the principle of the speed-up condenser. The structure other than the first resistance variable means enclosed by the chain line is the same as FIG. 8, and its explanation is omitted. The first resistance variable means in this embodiment includes between the gate and source of Q1, a series connection of a resistor R2 and M2 which performs switching by a driving signal Soff, and a speed-up condenser C4 is connected in parallel with R2. In the period from t2 to t3 shown in the operation waveform in FIG. 9, in the case where the gate voltage of Q1 changes rapidly and a large gate current flows, the impedance of the speed-up condenser C4 becomes smaller than R2, and makes a gate current flow. In the next period from t3 to t6, when a change with time of the gate voltage of Q1 becomes small, the impedance of C4 becomes high, and R2 functions as a gate resistance. Thus, in FIG. 10, the value of the resistance of R2 is made large about 10 times as compared with the example of FIG. 8, and in the period from t2 to t3 of initial stage of turn off, if R2 is used as resistance means for discharging of the gate current, and in the period from t4 to t6 of breakdown of the zener diode ZD2, if R2 is used as a gate resistance, it is possible by the principle described in FIG. 8, to decrease the current of the zener diode and to achieve the reduction of the loss. In FIG. 10, if the impedances of C4 and M2 are too small, the gate current will cause ringing, in this case connecting a small resistance to C4 in series avoids the ringing. It is suitable for the operation of the present invention to select the value of this small resistance as about 10 times smaller than R2.

In the driving apparatus 1 shown in FIGS. 1 to 10, with the exception of the capacitors C1 to C4, the MOSFETs, resistors, zener diode, amplifier, and comparator are all suitable parts for the integrated circuit (IC), and these parts may be constituted with one or a plurality of IC chips. By using the IC, the operation delay of the circuit is shortened to a great extent, and more suitable characteristic can be obtained for the aim of the present invention.

Figure 11:
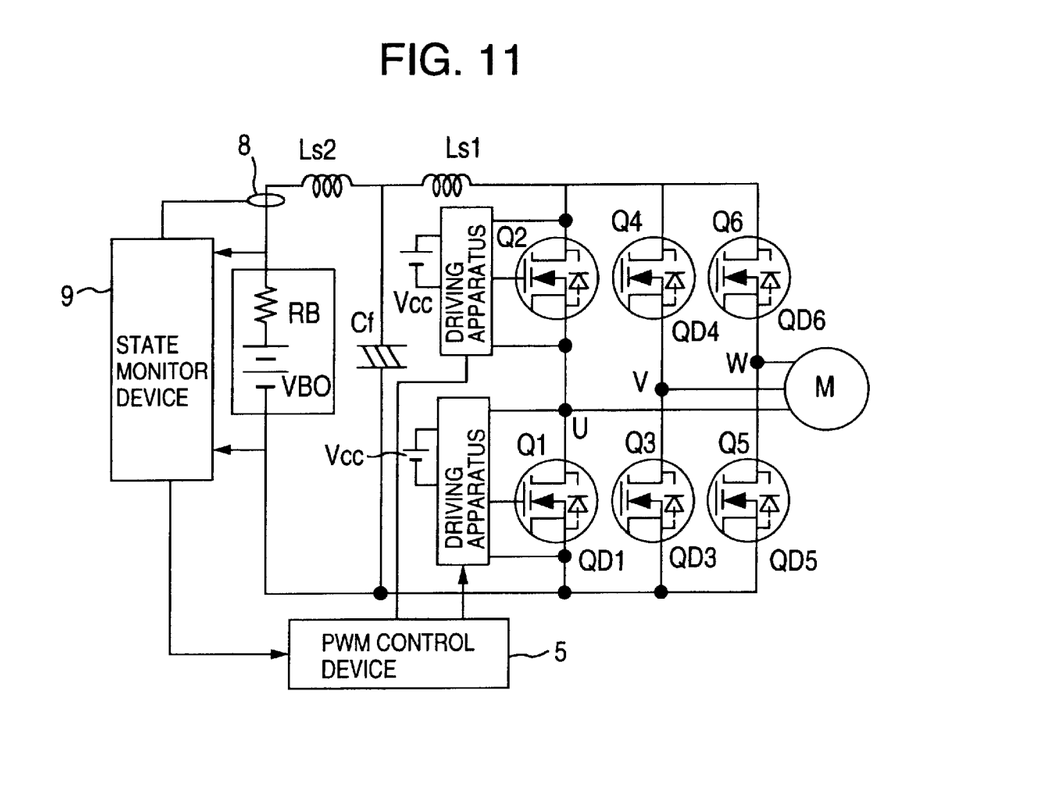
FIG. 11 is a block diagram of an electric power conversion apparatus for explaining a control method of the present invention.

FIG. 11 shows a structure of a power conversion system in which electric power is supplied from a large capacity battery to an inverter apparatus including a driving apparatus according to the present invention.

In FIG. 11, a 3-phase inverter including power semiconductor elements Q1–Q6, a motor M connected to the 3-phase inverter as a load, a driving apparatus 1, the same as shown in FIG. 1 or 8, associated with Q1–Q6, a control power supply Vcc for supplying electric power to the driving apparatus 1, and a control device 5 for transmitting a PWM signal to the driving apparatus 1 are the same contents as described in FIG. 1 or 8, and the explanation thereof is omitted. Ls1 denotes a parasitic inductance of wiring connecting a smoothing condenser CF to the 3-phase inverter, Ls2 similarly denotes a parasitic inductance of wiring connecting a battery VB to the smoothing condenser CF. Then, if the battery VB is expressed by an equivalent circuit, it will be represented by an internal resistance and an open circuit voltage VBO. The current which charges or discharges this battery VB is measured by a current sensor 8, and a current measurement result is sequentially transmitted to a state monitor device 9 of the battery. Also, the state monitor device 9 measures a voltage of the battery VB, and the internal resistance RS and the open circuit voltage VBO are estimated from the measured current and voltage information of the battery VB, and are transmitted to the control device 5.

In the present invention, when the battery VB conducts a large current, due to the effect of the internal resistance RB, the voltage between the positive and negative poles appears decreased or increased than the true voltage (open circuit voltage VBO), and hence it is the aim of the present invention to apply this principle as a control method relating to the above-mentioned driving apparatus.

As described in the above-mentioned equations (1) and (2), assuming that the parasitic inductance of the wiring existing within a closed circuit including the smoothing condenser CF and the power semiconductor elements is expressed by Ls1, an instantaneous value of the main current output by the power semiconductor elements Q1–Q6 is expressed by I (a discharge current for the battery), the effective value of this current is expressed by Iav, a voltage between the positive and negative poles of this battery is expressed by VB, an open circuit voltage is expressed by VBO, an internal resistance of the battery is expressed by RB, a maximum voltage of the power semiconductor element when the surge voltage is suppressed by the driving apparatus is expressed by Vc (corresponds to Vds (Q1) in the period t5–t6 in FIG. 2), and time at which the power semiconductor element interrupts the current is expressed by tf, these parameters have the following relationship. The surge voltage generated during the current interrupting period is $$Ls1 \times dI/dt = Vc - VB \quad (3)$$

When dI/dt is linearly approximated $$dI/dt = I/tf \quad (4)$$

The voltage between the positive and negative poles of the battery is reduced by the influence of the effective value Iav of the current conducted by the power semiconductor element during its on steady period, and the internal resistance, and it can be represented by $$VB = VBO - RB \times Iav \tag{5}$$

The surge voltage of equation (3) means that in the period from the time (t5 in FIG. 2) at which the interruption of the current started, until the electromagnetic energy stored in Ls1 is consumed (t6 in FIG. 2), the current can flow continuously while changing with a gradient of dI/dt. However, this current flows between the smoothing condenser and the parasitic inductance of the wiring, and the power semiconductor element, and the battery does never supply this current. Thus, in the battery, the voltage drop (RB×Iav) by the internal resistance and the current described in equation (5) is recovered. This recovery process exhibits a voltage change by exponential function having the time constant determined by the internal resistance RB and the capacitance Cf of the smoothing condenser. On the other hand, when considering from the view point of suppressing the surge voltage of the power semiconductor element, the time constant of RB and Cf is sufficiently long against the current fall period (t5–t6), and it is desirable that VB in equation (3) Is maintained at a low value. If Vc is selected to be a value 80 to 90% with respect to the withstand voltage of the power semiconductor element, it is possible to select dI/dt of the current fall period larger as VB is lower, and tf in equation (4) becomes short. This is related to shorten the delay time which was the problem in the prior art and to ensure the non-lap time. Supposing that Rb is for example 20 milliohms, and Cf is 5000 micro-farad, the time constant is 100 microseconds, and when the current fall time tf is selected to be less than or equal to 10% of the above-mentioned time constant, it is sufficiently short with respect to the recovery of the battery voltage, and the battery voltage is nearly equal to the value before the current interruption. The non-lap time of PWM has the upper limit of 5 microseconds, and with respect to the above-mentioned example, it correspond to 5%, and meets the condition of less than or equal to 10%. As to the control of the delay time, it is only necessary to set the clamp value Vc of the voltage in the current fall period, by using the reference value Vref in FIG. 1, or the breakdown voltage of the zener diode ZD2 in FIG. 8. In this respect, the equations (3)–(5) are dependent on the amplitude I of the interrupting current, and in setting the above-mentioned Vc, the maximum value of the main current, or thermally, the effective value of the maximum main current is taken into consideration.

Furthermore, from equations (3) and (4), since the time tf is expressed by $$tf = L \times I / (Vc - Vb + RB \times Iav) \tag{6}$$

the control device 5 executes the calculation of equation (6) based on the information obtained from the state monitor device 9 of battery, and it is possible to set the non-lap time longer than tf in the PWM signal. According to this control method, even when the amplitude I of the interrupting current is changed, the accurate current fall time tf can be grasped, and can be reflected on the non-lap time.

In the driving apparatus according to the present invention, a gate voltage obtained by voltage dividing by first resistance variable means and second resistance variable means which are respectively changed according to a control voltage and a voltage between input and output terminals is applied to a power semiconductor element, and it is possible to stably suppress the surge voltage generated during the current fall period.

According to the control method of the present invention, at the time of reverse recovery of the return diode, a power semiconductor element in parallel with the return diode is dV/dt turned on in a short time, thereby to enable to suppress the surge voltage. Due to the dV/dt turn on, although the switching loss is slightly increased, the steady loss is reduced to a great extent by lowering the withstand voltage, and as a whole, the effect of reducing the loss can be attained. Furthermore, by setting the reference value of the second resistance variable means or the breakdown voltage of the zener diode by taking into consideration the influence of the internal resistance, it is possible to optimize the voltage at the time of suppressing the surge, and to shorten the current fall time. Moreover, it becomes possible to set the non-lap time of the PWM control which takes this time into consideration.

What is claimed is:

1. A driving apparatus of a power semiconductor element for conducting or interrupting a main current, comprising a power semiconductor element having a first and a second terminal for input and output of a main current, and having a control gate terminal; and driving circuit means for applying or removing a control voltage supplied from a control power supply to and from said control gate terminal responsive to an input signal; said driving apparatus further comprising:

first resistance variable means including first resistance means for changing a resistance value according to said control voltage, and switching means for conducting or interrupting a current to and from the first resistance means according to said input signal; and second resistance variable means including second resistance means for limiting a conductable current according to a voltage between the first and second terminals, wherein one of the voltage of said control power supply and said voltage between the first and second terminals is voltage divided by the first resistance means and the second resistance means, and the divided voltage is applied to said control gate terminal at the time of conducting or interrupting said main current.

2. A driving apparatus of a power semiconductor element according to claim 1, wherein said first resistance variable means includes said first resistance means connected between said control gate terminal and said second terminal, said switching means for conducting or interrupting a current to and from said first resistance means according to the input signal, first voltage detecting means for detecting a voltage between said control gate terminal and said second terminal, and first resistance control means for changing a resistance value of said first resistance means according to an output of said first voltage detecting means.

3. A driving apparatus of a power semiconductor element according to claim 1, wherein said first resistance means includes a resistor connected between the control gate terminal and the second terminal, and capacitance means connected in parallel with the resistor.

4. A driving apparatus of a power semiconductor element according to claim 3, wherein said second resistance variable means includes second voltage detecting means for detecting a voltage between the first and the second terminal, amplifying means for comparing a difference between an output of the second voltage detecting means and a reference value set beforehand, and second resistance control means for changing a resistance value of the second resistance means.

5. A driving apparatus of a power semiconductor element according to claim 3, wherein said second resistance variable means includes second voltage detecting means for detecting a voltage between the first and the second terminal, amplifying means for comparing a difference between an output of the second voltage detecting means and a reference value set beforehand, and second resistance control means for changing a resistance value of the second resistance means.

6. A driving apparatus of a power semiconductor element according to claim 5, wherein a zener diode connected between the first and the second terminal is provided as the second resistance means, and a voltage between the first and the second terminal which is divided by the first resistance means and a voltage between the terminals of the zener diode is applied to said control gate terminal.

7. A driving apparatus of a power semiconductor element according to claim 1, wherein a zener diode connected between the first and the second terminal is provided as the second resistance means, and a voltage between the first and the second terminal which is divided by the first resistance means and a voltage between the terminals of the zener diode is applied to said control gate terminal.

8. A driving apparatus of a power semiconductor element according to claim 4, further comprising limiting means for limiting the output of said amplifying means.

9. A control method of the apparatus of claim 2, comprising the step of: regulating at least one of a gain of the first resistance control means, a reference value provided for the amplifying means, and a gain of the second resistance control means, thereby to control the change with time of the control voltage to achieve a desired characteristic.

10. A control method of the apparatus of claim 4, comprising the step of: regulating at least one of a gain of the first resistance control means, a reference value provided for the amplifying means, and a gain of the second resistance control means, thereby to control the change with time of the control voltage to achieve a desired characteristic.

11. A control method of a power semiconductor element which includes a control gate terminal, a first and a second terminal for input and output of a main current, and a diode provided between the first and the second terminal, comprising the step of: applying or removing a control voltage to and from the power semiconductor element for conducting or interrupting the main current; wherein in said step of removing the control voltage, a resistance provided between the control gate terminal and the second terminal is increased to a predetermined value, and a displacement current flowing into the control gate from the first terminal at the time of reverse recovery of the diode and a voltage drop caused by the resistance, add to remained said control gate voltage, and said control gate voltage is made to be slightly larger than a gate threshold voltage of the power semiconductor element.

12. A control method for supplying a main current to a semiconductor element including a driving apparatus according to claim 4 from a battery as a power supply through a condenser, comprising the steps of:

determining a time tf in which the semiconductor element interrupts the current to meet the following formula $$tf = L \times I/(Vc - Vb + Rb \times Iav)$$

where, a total value of parasitic inductance of wiring existing in a closed circuit including said condenser and said power semiconductor element is expressed by L, a static capacity of said condenser is expressed by C, an instantaneous value of the main current output by said power semiconductor element is expressed by I, an effective value of this current is expressed by Iav, an open circuit voltage of said battery is expressed by Vb, an internal resistance of the battery is expressed by Rb, and a reference value of said amplifying means or a voltage clamp value of said power semiconductor element determined by said zener diode is expressed by Vc, and setting said reference value or said zener diode so that with respect to an instantaneous maximum value of the main current, the time tf is equal to 10% or lower of the time constant determined by Rb×C.

13. A control method for supplying a main current to a semiconductor element including a driving apparatus according to claim 8 from a battery as a power supply through a condenser, comprising the steps of:

determining a time tf in which the semiconductor element interrupts the current to meet the following formula $$tf = L \times I/(Vc - Vb + Rb \times Iav)$$

where, a total value of parasitic inductance of wiring existing in a closed circuit including said condenser and said power semiconductor element is expressed by L, a static capacity of said condenser is expressed by C, an instantaneous value of the main current output by said power semiconductor element is expressed by I, an effective value of this current is expressed by Iav, an open circuit voltage of said battery is expressed by Vb, an internal resistance of the battery is expressed by Rb, and a reference value of said amplifying means or a voltage clamp value of said power semiconductor element determined by said zener diode is expressed by Vc, and setting said reference value or said zener diode so that with respect to an instantaneous maximum value of the main current, the time tf is equal to 10% or lower of the time constant determined by Rb×C.

14. A control method according to claim 13, wherein an inverter portion is constituted including at least two power semiconductor elements connected in series, said method further comprising the steps of:

in order to PWM control the inverter portion, applying a control signal to the driving apparatus by a PWM signal generating portion, and providing a non-lap time longer than said tf to the output of said PWM signal generating portion.

* * * * *